(12) United States Patent
Böttner et al.

(10) Patent No.: US 7,402,910 B2
(45) Date of Patent: Jul. 22, 2008

(54) SOLDER, MICROELECTROMECHANICAL COMPONENT AND DEVICE, AND A PROCESS FOR PRODUCING A COMPONENT OR DEVICE

(75) Inventors: Harald Böttner, Freiburg (DE); Axel Schubert, Munich (DE); Martin Jaegle, Sexau (DE)

(73) Assignees: Micropelt GmbH, Freiburg (DE); Fraunhofer Gesellschaft zur Forderung der angewandten Forschung e.V., Munich (DE)

( * ) Notice: Subject to any disclaimer, the term of this patent is extended or adjusted under 35 U.S.C. 154(b) by 0 days.

(21) Appl. No.: 10/789,423

(22) Filed: Feb. 27, 2004

(65) Prior Publication Data

US 2004/0238966 A1    Dec. 2, 2004

(30) Foreign Application Priority Data

Feb. 27, 2003    (DE) ................................ 103 09 677

(51) Int. Cl.
    *H01L 23/48*    (2006.01)
    *H01L 23/52*    (2006.01)
    *H01L 29/40*    (2006.01)
(52) U.S. Cl. .................. 257/772; 257/E23.028; 257/E23.082
(58) Field of Classification Search ............ 257/772
See application file for complete search history.

(56) References Cited

U.S. PATENT DOCUMENTS

| 4,636,073 | A | 1/1987 | Williams |
| 5,320,272 | A | 6/1994 | Melton et al. |
| 5,966,939 | A * | 10/1999 | Tauchi ......................... 62/3.2 |
| 6,077,380 | A * | 6/2000 | Hayes et al. ................. 156/283 |
| 6,319,617 | B1 | 11/2001 | Jin et al. |
| 2001/0020744 | A1 * | 9/2001 | Kuramoto et al. ........... 257/738 |
| 2004/0067604 | A1 * | 4/2004 | Ouellet et al. ............... 438/108 |

FOREIGN PATENT DOCUMENTS

| DE | 1 199 103 | 8/1965 |
| DE | OS 2 054 047 | 5/1972 |
| DE | 694 04 789 T2 | 10/1994 |
| DE | 198 45 104 A1 | 4/2000 |
| EP | 0 180 756 A1 | 5/1986 |

OTHER PUBLICATIONS

Hansen, Max, Ph.D. *Constitution of Binary Alloys*. New York: McGraw-Hill, 1958, pp. 188-189.

* cited by examiner

*Primary Examiner*—Evan Pert
*Assistant Examiner*—Ben P Sandvik
(74) *Attorney, Agent, or Firm*—Dickstein Shapiro LLP

(57) ABSTRACT

A solder, in particular a thin-film solder, for joining microelectromechanical components, wherein the solder is a eutectic mixture of gold and bismuth. Components and devices joined by a solder of this type are also disclosed, in addition to processes for producing such components or devices.

12 Claims, 8 Drawing Sheets

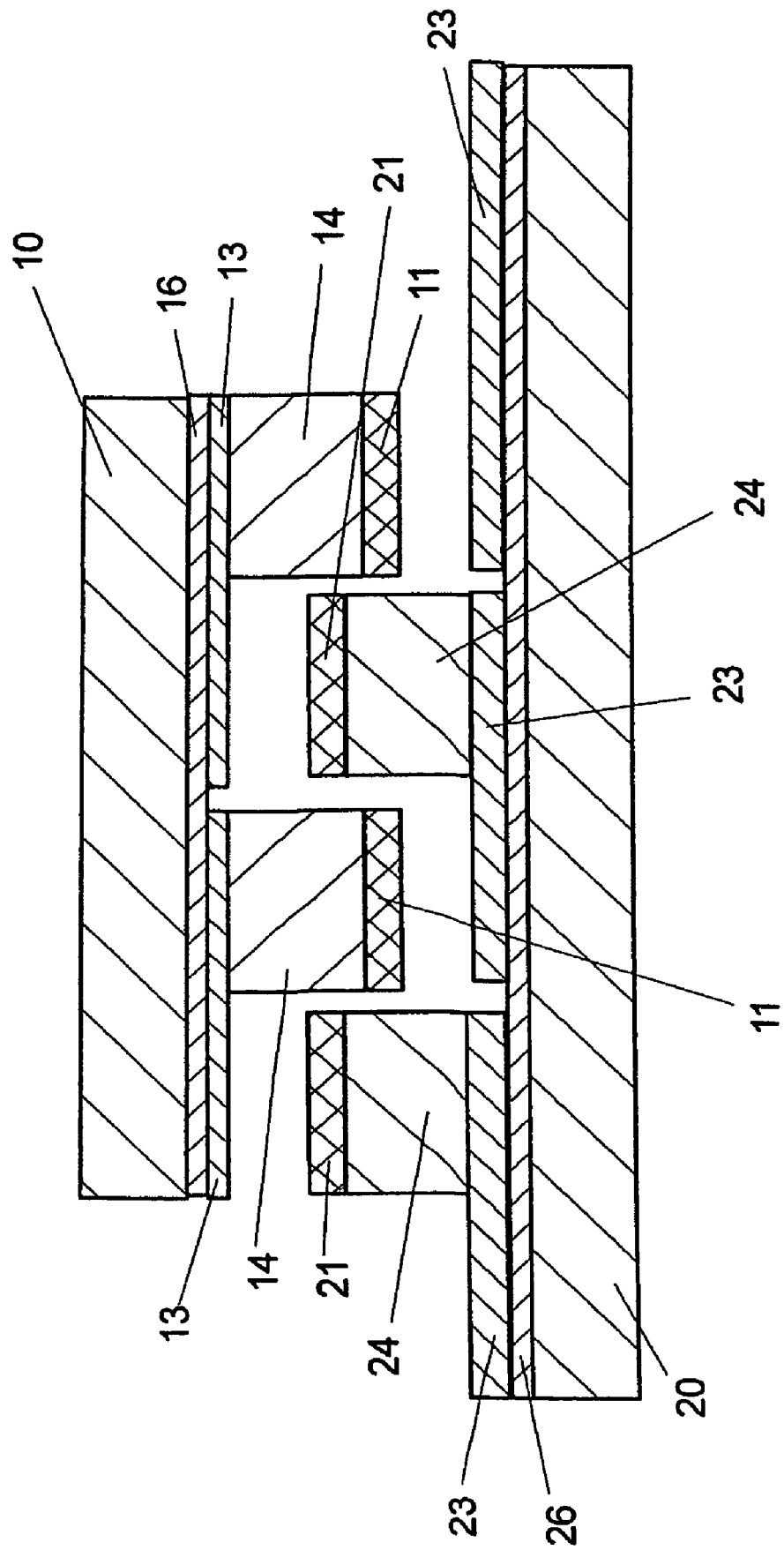

SOLDER, MICROELECTROMECHANICAL COMPONENT AND DEVICE, AND A PROCESS FOR PRODUCING A COMPONENT OR DEVICE

FIELD OF THE INVENTION

The invention relates to a solder for joining microelectromechanical components, to a microelectronical and/or microelectromechanical component formed using this solder, to a microelectromechanical device formed using this solder, and to a process for producing a component or device using this solder.

BACKGROUND OF THE INVENTION

Laid-open specification DE 19 845 104 A1 describes a process for producing a microelectromechanical device, namely a thermoelectric transducer, produced in various embodiments at wafer level. In some embodiments, the thermoelectric components are assembled from two substrate wafers, coated with the respective complementary n/p materials, to form a component.

The microelectromechanical device (in this case a transducer) is composed of a plurality of components. It is then possible for further components (e.g. a laser diode) to be arranged on the component.

During fabrication of the thermoelectric transducer, in the final process steps the two wafers have to be patterned and soldered with respect to one another. DE 198 45 104 A1 gives a range of processes for doing this. The gold-tin system is given as a suitable solder which has to be capable of being patterned for applications in device and/or component fabrication. This solder makes it possible to achieve a soldering temperature required for the component functionality of just above the eutectic temperature of 278° C. Gold-tin is used as the standard solder for a wide range of applications in electrical engineering, partly also on account of its relatively noble character (high gold content).

One drawback of the gold-tin solder material is that this material, for use in thin-film technologies, for example in the case of sputtered contacts, has to be produced as a special target having approximately the same overall composition as the eutectic alloy. It is known that the composition of multicomponent targets changes over the course of time as a result of preferential sputtering of different elements, and consequently the basic problem of a change in the composition of the sputtered thin film is ever present.

A similar problem arises with thermal evaporation from a mixing source. A further significant drawback of this solder for the wafer/wafer bonding referred to above also results direct from the phase diagram of the gold-in system (cf. FIG. 1). Starting at the eutectic containing 70 atomic % of gold, the temperature of the solidus curve rises considerably as the gold content increases. A possible increase in the gold content in the sputtered layer compared to the target would lead to a considerable rise in the soldering temperature required. This makes process optimization more difficult.

Since the soldering operation has to be carried out at the lowest possible temperatures in order to protect the overall structure of the device, the soldering temperature must not greatly exceed the eutectic temperature of 278° C.

SUMMARY OF THE INVENTION

The invention is therefore based on the object of providing a solder which does not have these features and in particular is easy to process and pattern.

A eutectic mixture of gold and bismuth results in good patterning properties. Furthermore, bismuth can be used in element form, the element bismuth being nontoxic when handled in the customary way, and consequently there is no need of any of the safety labels required under German regulations. Furthermore, bismuth is known to be a noble element and is found in native form in nature. Also, bismuth is easy to process and etch in thin-film processes. The eutectic mixture of gold and bismuth even has a lower eutectic temperature than the known gold-tin solder material. The solder according to the invention can be successfully soldered to gold, which is ensured by the eutectic contact. The eutectic mixture of gold and bismuth is explained in more detail below.

Furthermore, the invention is based on the object of providing a microelectromechanical component which can be soldered efficiently.

The object is also achieved by a microelectromechanical component having at least one soldering layer for joining to at least one further component, with at least one soldering layer comprising a solder according to the invention. However, it is also possible for the component according to the invention to include a gold layer for producing a soldered joint with a bismuth layer, or a bismuth layer for producing a soldered joint with a gold layer. In both the latter cases, one component is provided with a first solder partner (e.g. gold), which is then joined by heating to another component having the second solder partner (e.g. bismuth), which is complementary to the first solder partner.

The component advantageously includes soldering layers on opposite sides for joining to at least two further components. This allows compact overall structures to be produced.

In an advantageous configuration, at least one soldering layer, prior to the soldering operation, has a layer thickness of from 100 nm to 10 μm, in particular 1 to 2 μm.

A further object of the invention is to provide a microelectromechanical device which can be assembled efficiently using soldered joints.

This object is achieved by a microelectromechanical device in which a soldered joint according to the invention joins at least two components, of which at least one component has an electrical functionality, thermal functionality and/or bonding functionality. A device may even become a component of a further, more complex device. According to the invention, the components are joined at least partially using the soldered joint according to the invention.

In this context, it is advantageous for at least one soldered joint to join together two substrates, each with thermoelectric material arranged thereon. This makes it easy to construct thermoelectric transducers or Peltier elements.

It is advantageous for a soldered joint to join a component to a laser diode device. This makes it possible, for example, to use Peltier cooling elements to cool laser diodes.

It is also advantageous if at least one soldered joint joins a component to a fluidic cell, an IDC structure as humidity sensor and/or a component with a heat sink. Furthermore, it is advantageous if at least one soldered joint joins a component to an optoelectronic amplifier, an optoelectronic modulator, an LED, a photodiode, a phototransistor and/or an optocoupler. In all cases, it is possible to achieve very compact overall structures.

In a further advantageous configuration, a joint is formed by means of submount technology using the solder associated with the present invention. The soldered joint contains at least a proportion of gold-bismuth.

Finally, it is also an object of the present invention to provide a process for producing a microelectromechanical component or device.

The object is also achieved by a process in which:

a) bismuth, gold or a mixture of bismuth and gold is applied as first soldering partner to a first side of a soldered joint, and then b) to produce a eutectic soldered joint, the first solder partner is combined with a second, complementary solder partner comprising gold, bismuth or a mixture of gold and bismuth under the action of heat.

Therefore, the solder partners may be pure metals (gold, bismuth) or mixtures of these pure metals. After cooling, the result is a soldered joint which completely or partially includes a eutectic compound of gold and bismuth.

It is particularly advantageous if gold as second solder partner is applied to a second side of the soldered joint in a form which is complementary to bismuth as the first solder partner. It is also advantageous if the solder partners gold and bismuth are each applied to the sides of the soldered joint in a composition which is such that, after the soldering operation, the concentration ratios are those of a gold-bismuth eutectic.

It is advantageous for at least one layer of the soldered joint to be applied using a thin-film method, in particular a PVD process, such as evaporation coating, sputtering or molecular beam epitaxy.

In a further advantageous configuration of the invention, at least one layer of the soldered joint is produced using a CVD process or by the application of a paste.

It is also advantageous if the patterning of at least one layer of the soldered joint is performed by dry etching and/or wet etching. As an alternative or in addition, it is advantageous if the patterning of at least one soldering layer of the thin-film soldered joint is performed using a thin-film solder as part of a lift-off process.

BRIEF DESCRIPTION OF THE DRAWINGS

The invention is explained in more detail below with reference to the figures of the drawings and on the basis of a number of exemplary embodiments. In the drawings:

FIGS. 6A and 6B show an exemplary embodiment with a eutectic thin-film soldered joint in a microelectromechanical device with additional functional layers.

DESCRIPTION OF A PREFERRED EXEMPLARY EMBODIMENT

Figure 1:
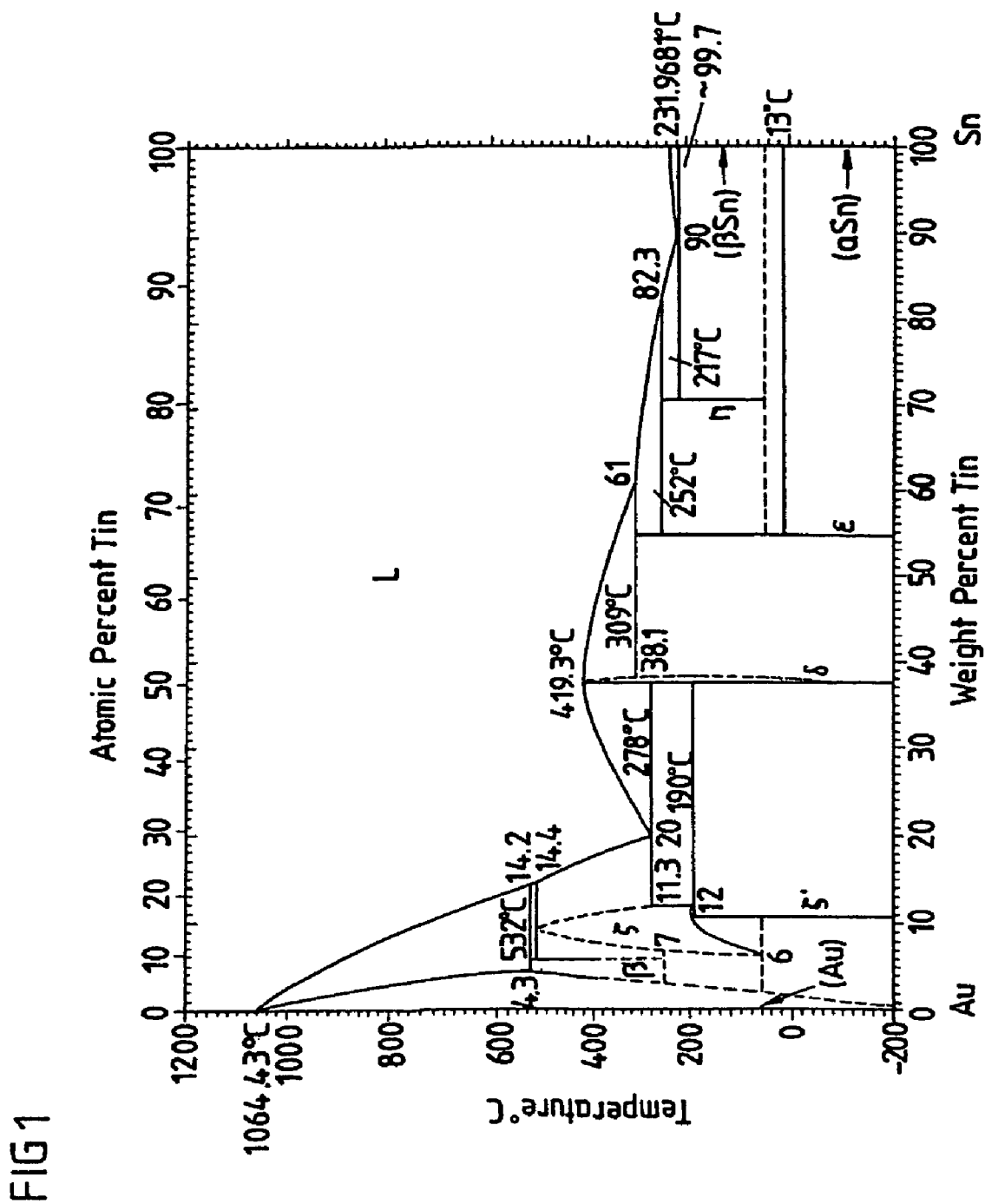
FIG. 1 shows the phase diagram of the known gold-tin thin-film solder.

FIG. 1 illustrates a phase diagram for the binary gold-tin (AuSn) system, which is used as thin-film solder in the electronics industry.

The eutectic at 30 atomic % tin, 70 atomic % Au (upper x axis) is of relevance to the present invention.

Figure 2:
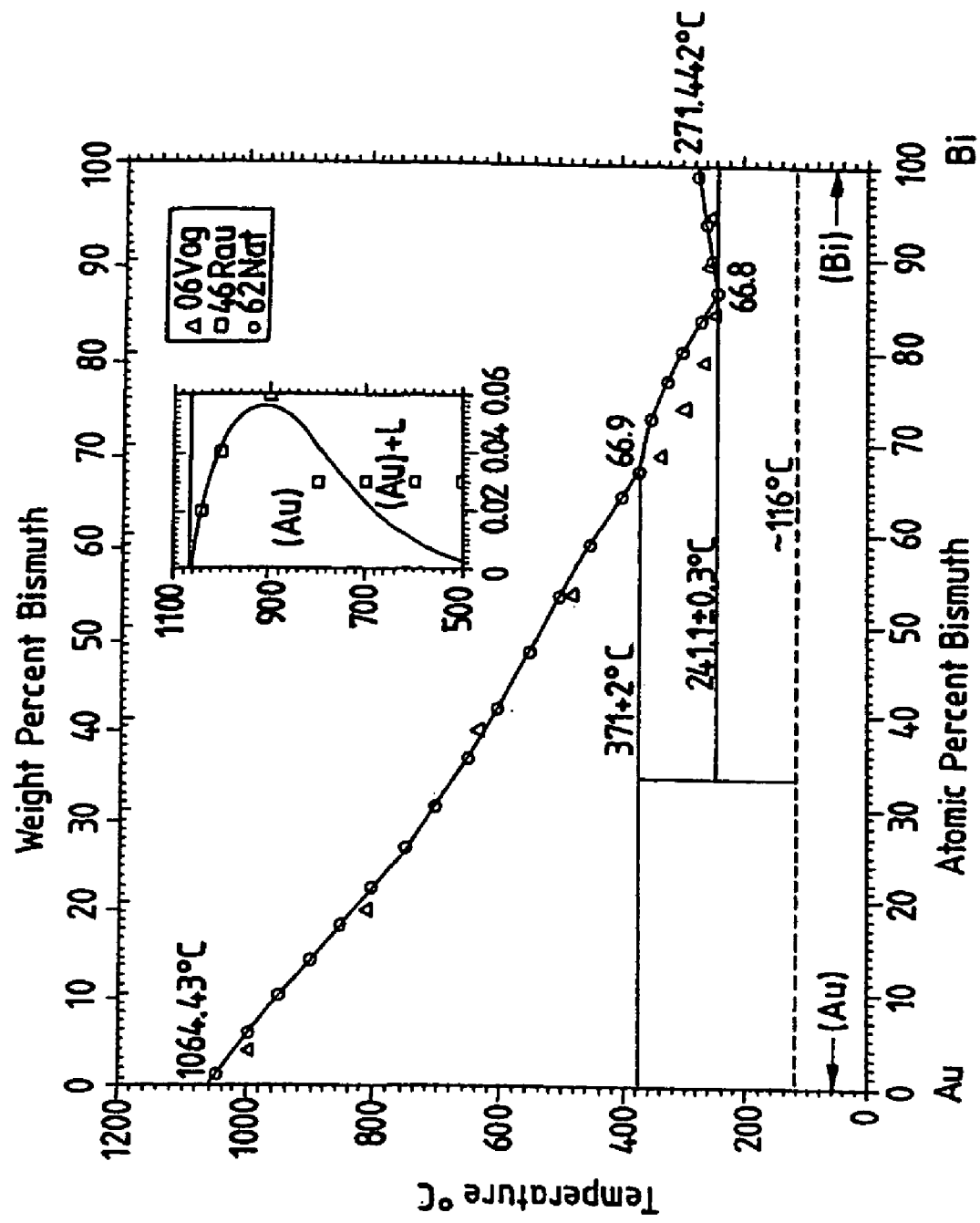
FIG. 2 shows the phase diagram of the gold-bismuth solder according to the invention.

FIG. 2 shows a phase diagram for an embodiment of the thin-film solder according to the invention with a gold-bismuth (AuBi) system. The atomic percentages of bismuth are plotted on the lower x axis. This materials system has the required low eutectic temperature, namely 241° C. at approx. 87 atomic % of bismuth. The solidus curve rises only slowly, starting from the eutectic point, i.e. the temperature of the final melt is less sensitive to minor fluctuations in concentration.

For the production of thin-film thermoelectric devices, as in DE 198 45 104 A1, the fabrication sequence described in that document is considerably simplified when a gold-bismuth system is used. The soldering partner bismuth, unlike the soldering partner gold-tin (cf. above), can readily be patterned. In this case, wet-chemical processes do not form any harmful reaction products. The soldering operation is simplified by the considerable uptake of gold in bismuth of 20 atomic % at approximately 300° C., with the formation of the $Au_2Bi$—Bi eutectic during cooling (cf. FIG. 2). For the sake of simplicity, the $Au_2Bi$—Bi eutectic is also referred to as the gold-bismuth eutectic.

Starting with gold, the layer sequence gold, $Au_2Bi$ as primary precipitation, gold-bismuth eutectic, bismuth can be expected.

The shallow solidus curve in the vicinity of the eutectic furthermore results in a certain freedom in the design of the process used for soldering.

Possible applications of the thin-film solder according to the invention are also explained in the exemplary embodiments which follow. These first of all describe patterning of bismuth layers (FIGS. 3 and 4), which are then joined to gold layers to form embodiments of the thin-film soldered joints according to the invention (FIGS. 5 to 9).

FIGS. 3 and 4 only describe the production of a bismuth layer 1 on a substrate 10, the bismuth layer 1 then being soldered to a gold layer (not shown in FIGS. 3 and 4) on another substrate.

The soldering operation results in the formation of a gold-bismuth thin-film soldered joint 30, as illustrated in FIG. 5. An embodiment of this type can be used in particular for a sandwich joint between two parts of a thermoelectric device, as described in DE 198 45 104 A1.

Patterned, solderable bismuth layers 1 in the embodiments illustrated here are produced using the standard methods of thin-film technology. The solder according to the invention, the components and devices according to the invention and the process according to the invention are not, however, restricted to thin-film processes.

Figure 3A:
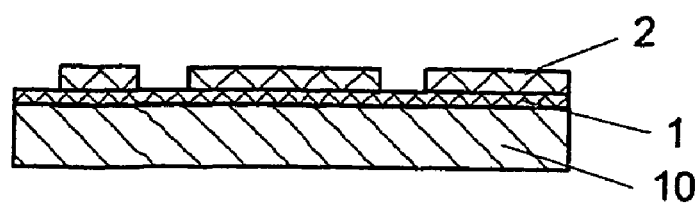
FIGS. 3A and 3B diagrammatically depict the production of a solderable bismuth thin film using an etching process.

FIG. 3A illustrates a substrate 10 for a microelectromechanical device, to which a bismuth layer 1 has been applied. This bismuth layer 1 is patterned by means of a photoresist layer 2 in a customary way, e.g. by dry etching or wet-chemical etching.

Figure 3B:
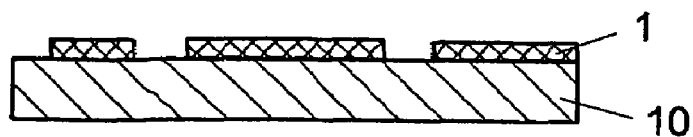

FIG. 3B shows the result after etching, namely a patterned bismuth layer 1 on the substrate 10. The photoresist layer 2 has already been removed.

In a similar way, it is possible to produce a gold layer on another substrate (not shown here), which gold layer is then able, by corresponding with the bismuth layer 1, to form a gold-bismuth thin-film soldered joint 30 in accordance with the invention. This is illustrated in FIG. 5.

The thicknesses of the two material layers (gold, bismuth) are in the range between a few hundred nm and 10 µm, preferably around 1-2 µm.

The materials used for the auxiliary process engineering layers for etching or lift-off depend, in terms of their nature and layer thickness, on the requirements of the soldering materials and on the patterning technology used. Gold and bismuth can preferably be used for the two soldering partners, and photo resist can preferably be used for both the etching technologies mentioned.

Figure 4A:
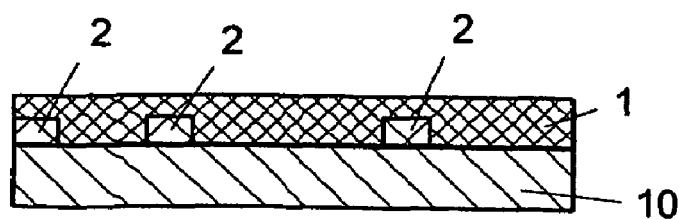
FIGS. 4A and 4B diagrammatically depict the production of a solderable bismuth thin film using a lift-off process.
Figure 4B:
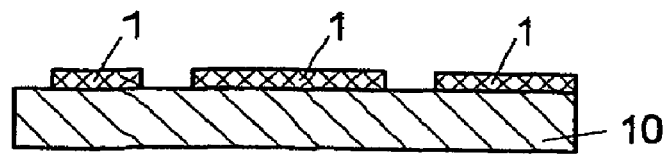

FIGS. 4A and 4B diagrammatically depict the production of one embodiment of the thin-film soldered joint according to the invention using a lift-off process. In this case, a photoresist layer 2 is patterned, then a bismuth layer 1 is applied to the photoresist layer 2 (FIG. 4A). After an etching step, the result is a patterned bismuth layer 1 on the substrate 10 (FIG. 4B).

The joining of a patterned bismuth layer 11 of this type to a gold layer 23 is illustrated in FIG. 5.

The thicknesses of the two materials (gold, bismuth) are in the range between a few hundred nm and 10 µm, preferably around 1-2 µm. The materials used for the auxiliary process engineering layers for etching or lift-off depend, in terms of their nature and layer thickness, on the requirements of the soldering materials and on the patterning technology employed. Gold and bismuth and standard physical coating processes can preferably be used for the two soldering partners, and photoresist, e.g. as sacrificial layers, can preferably be used for the lift-off process.

Figure 5A:
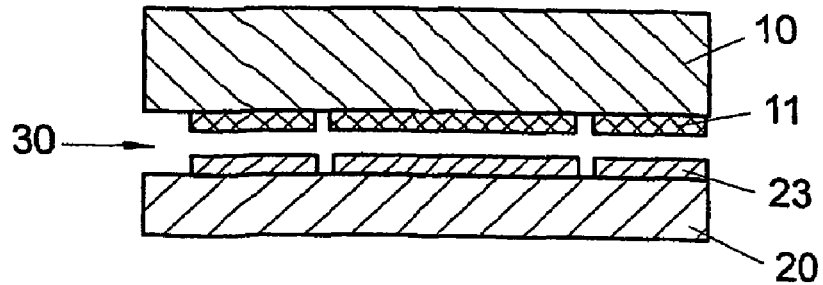
FIG. 5A shows an exemplary embodiment with a eutectic gold-bismuth thin-film soldered joint prior to the soldering operation.

FIG. 5A diagrammatically depicts a thin-film soldered joint 30 with patterned metal layers 11, 23 immediately before the soldering operation. In this case, the bismuth layer 11 is arranged, as first soldering partner, on a first substrate 10, and the gold layer 23 is arranged, as second solder partner, on a second substrate 20.

The bismuth layer 11 includes structures which correspond to the structures of the gold layer 23, i.e. it is possible to produce contact between the opposite solder partners.

Figure 5B:
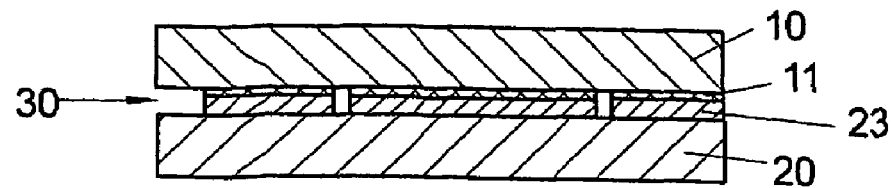
FIG. 5B shows the gold-bismuth thin-film soldered joint of the exemplary embodiment shown in FIG. 5*a* after soldering.

FIG. 5B diagrammatically depicts the exemplary embodiment of the eutectic gold-bismuth thin-film soldered joint 30 with patterned metal layers 11, 23 after the eutectic has formed.

The eutectic thin-film soldered joint 30 according to the invention is therefore produced by the joining of the bismuth layer 11 and the gold layer 23. After the soldering operation, the eutectic is formed between remaining parts of unused source material. The result is a sandwich structure.

Furthermore, as an alternative it is also possible, as in the case of the gold-tin, for the gold to bismuth eutectic composition to be preset as a physical mixture by using corresponding parameters during the respective physical coating method, so that under certain circumstances this mixture can be used as a solder layer.

Figure 6B:
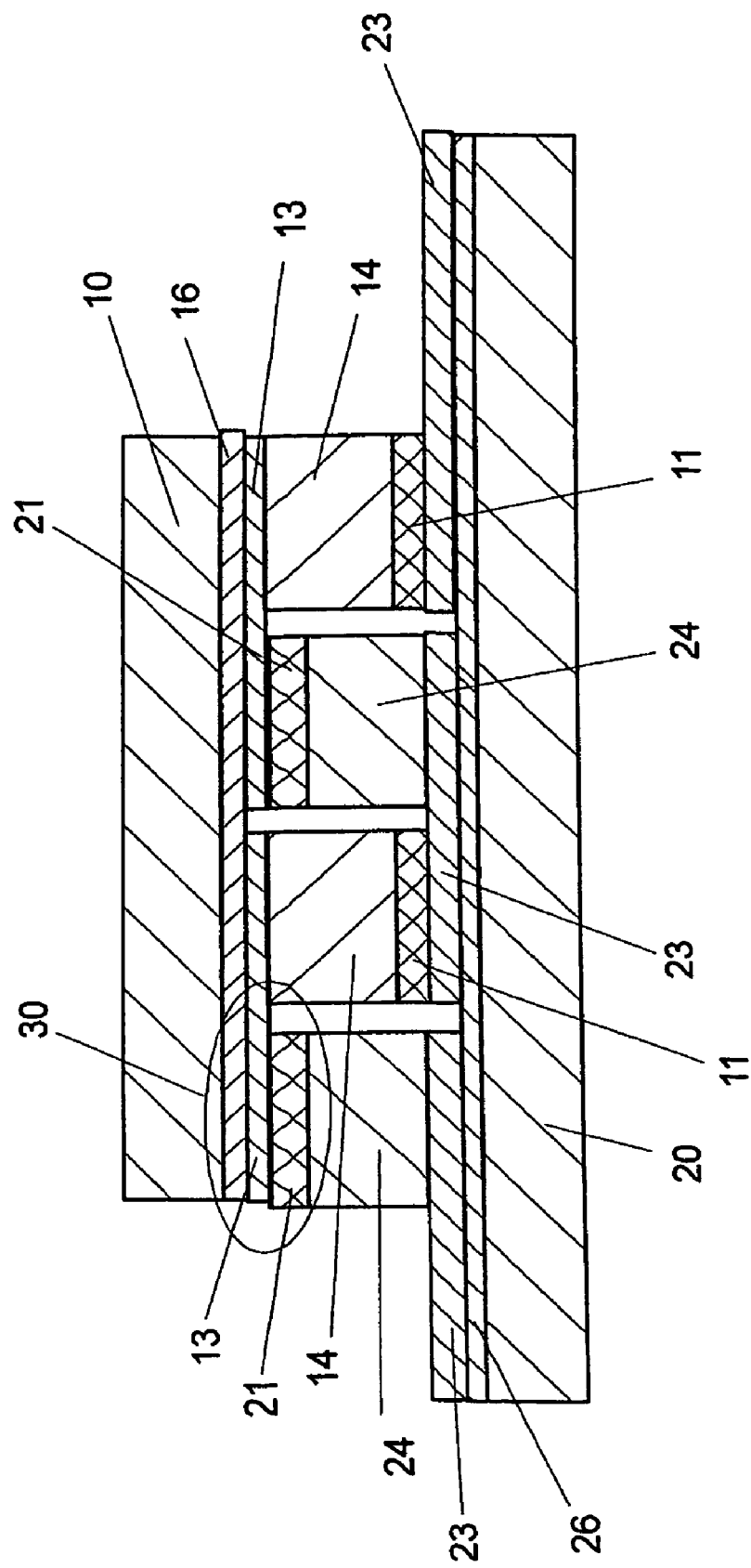

FIGS. 6A and 6B describe the use of the thin-film solder according to the invention in the construction of a microelectromechanical device.

The example used here is a thermoelectric device with two complementary n/p wafers 10, 20 as substrates; the substrates 10, 20 in this case represent the components from which the device is assembled. The form and structure of the complementary n/p wafers correspond to an exemplary embodiment as presented in DE 198 45 104 A1.

FIG. 6A shows the device prior to soldering using a eutectic gold-bismuth thin-film soldered joint.

The first substrate 10 is provided with a first insulating layer 16, on which a first gold layer 13, as bonding electrode, and a first patterned thermoelectric layer 14 are arranged. A first bismuth layer 11 is arranged on the structure of the first thermoelectric layer 14.

A corresponding second gold layer 23 as bonding electrode is formed on the second substrate 20. A second insulating layer 26 is arranged between the second bonding electrode 23 and the second substrate 20.

Analogously to the first substrate 10, the second substrate 20 has a second patterned layer of thermoelectric material 24, on which a second bismuth layer 21 is arranged.

The overall result is a thermoelectric device A with a sandwich structure which can be used, for example, as a Peltier cooler. FIG. 6B shows the two substrates 10, 20 after they have been joined together. Thin-film soldered joints 30 between bismuth layers 11, 21 and gold layers 13, 23 are formed at four locations.

FIGS. 6A and 6B show the metal layer arrangement for carrying out the eutectic soldering. Further metal layers which may be necessary under certain circumstances for layer bonding and/or diffusion barriers are not shown here.

The metal layer arrangement which is predetermined in FIGS. 6A and 6B, with gold 13, 23 on the substrate 10, 20 and bismuth 11, 21 on the functional thermoelectric layer 14, 24 may also be used in an inverse arrangement, i.e. with the bismuth and gold layers swapped over.

Figure 7:
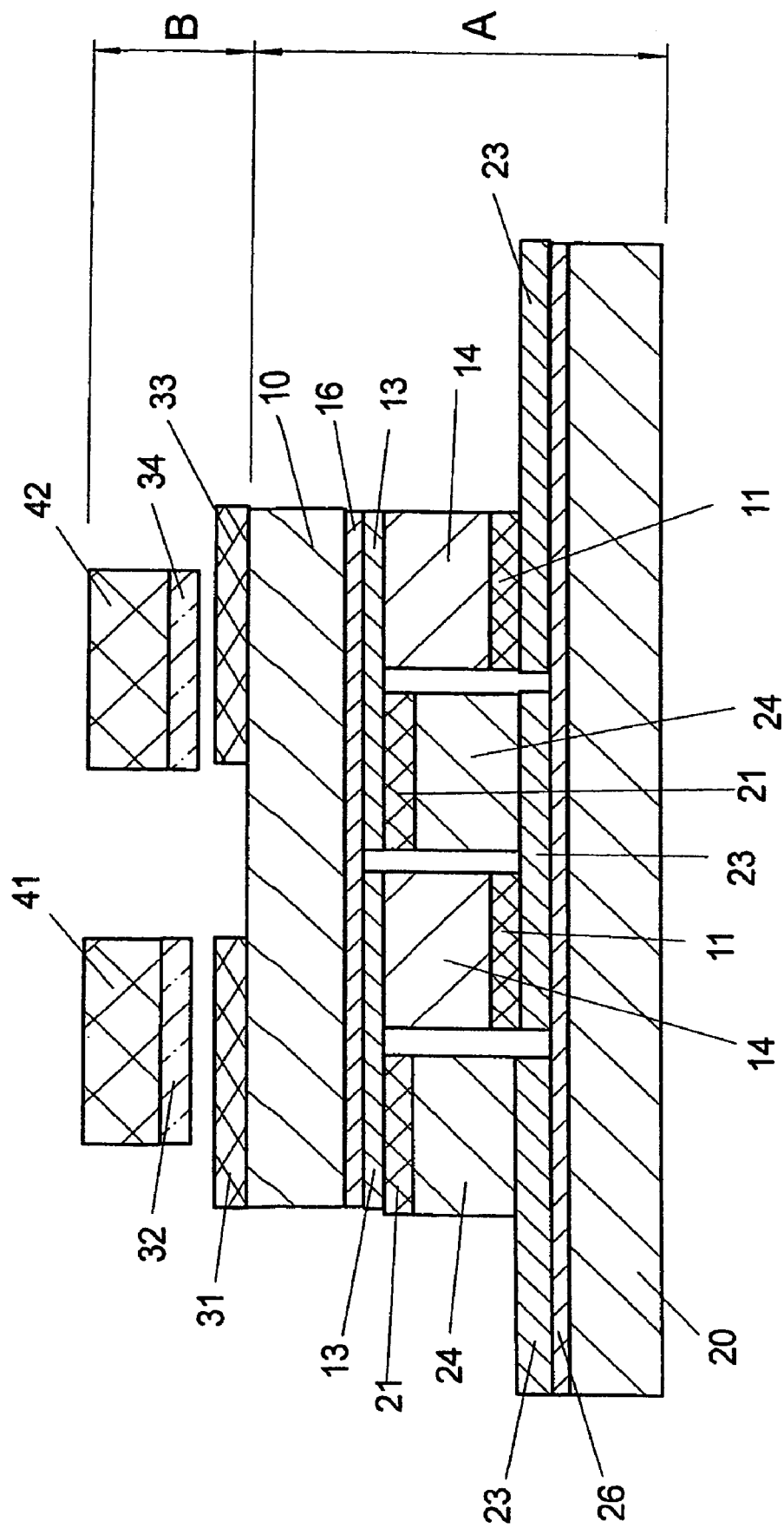
FIG. 7 shows an exemplary embodiment with a eutectic gold-bismuth thin-film solder with a device for laser cooling.

In a refinement of the exemplary embodiment shown in FIGS. 6A, 6B, and 7 diagrammatically depicts an exemplary embodiment relating to the use of the thin-film solder according to the invention without electrical functionality.

The device A shown in FIG. 6B is illustrated as the lower part of FIG. 7. An upper component B is then joined to the device A, so that a new device is formed from the components A, B. For a description of the individual layers of what is now the new component A, reference may be made to the description provided in connection with FIGS. 6A and 6B.

The component A in its entirety (Peltier element, thermoelectric element) can be used as a cooling device for a laser diode 41, 42. In this case, the thin-film solder according to the invention is used to bond on the laser chips 41, 42 and, at the same time, for one of the electrical connections of the laser which has been bonded on; it is likewise possible for both the possible layer sequences for the solder metals to be used for this purpose. This exploits both the internal bonding quality of the eutectic compound, the good thermal coupling to the Peltier heat sink, and the electrical functionality. This is an example of the use of the thin-film solder in submount technologies. In this case, one of the substrates 10 of the Peltier cooler is used on both sides.

A bismuth contact 31 and a gold contact 33 are arranged on the top side of the first substrate 10 and can each be joined to laser diodes 41, 42. The first laser diode 41 is provided with a third gold layer 33, which is complementary to the bismuth contact 31. The second laser diode 42 is provided with a third bismuth layer 34, which is complementary to the gold contact 33.

Figure 8:
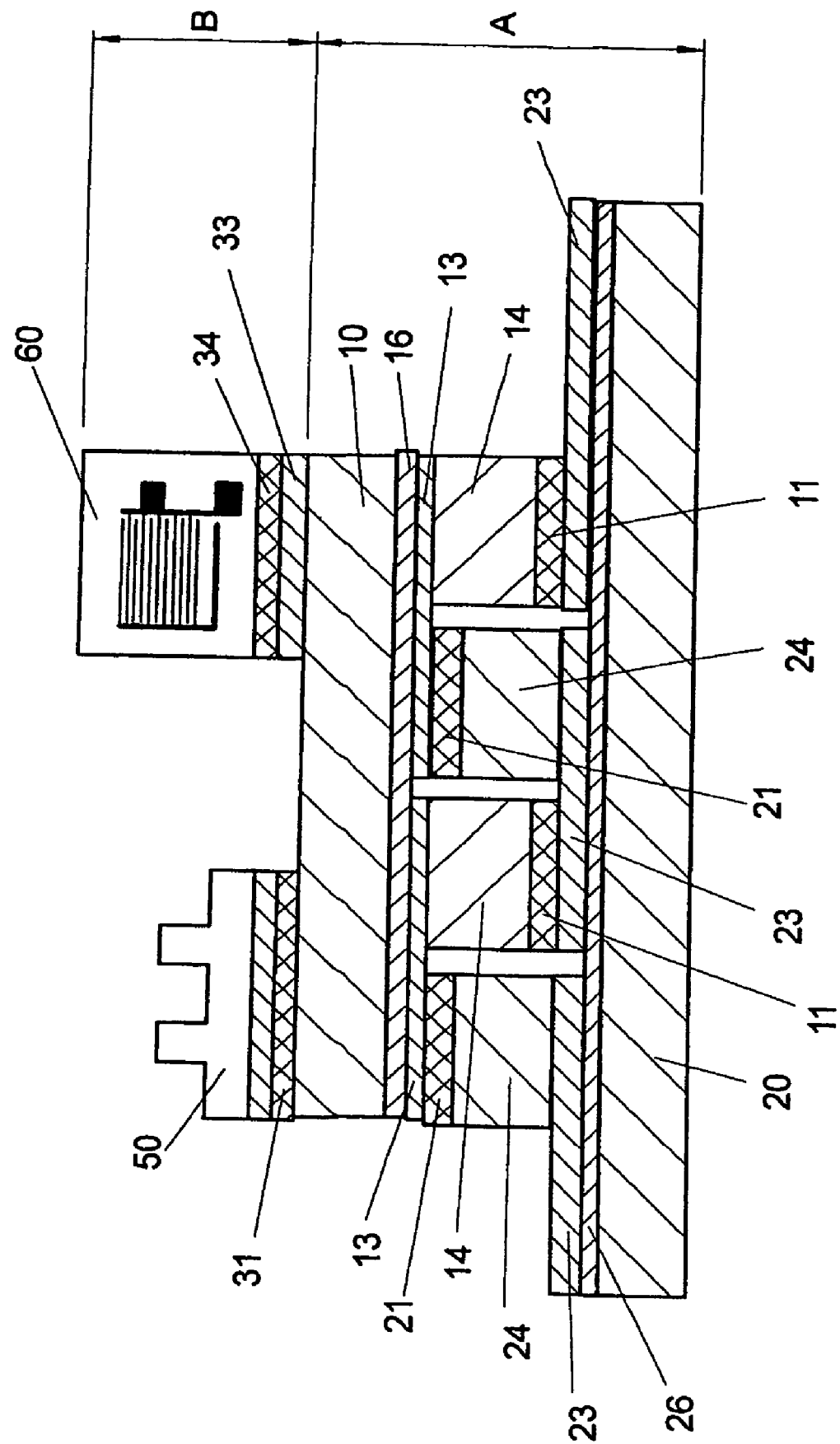
FIG. 8 shows an exemplary embodiment of a thin-film soldered joint according to the invention with a fluidic cell and/or an IDC structure.

Starting from the component A shown in FIG. 6B, FIG. 8 describes two further embodiments. In this case, the eutectic thin-film solder is used as bonding contact without electrical functionality, specifically to receive thermally coupled fluidic cells 50 and/or to receive an interdigitated capacitor structure (IDC structure) for humidity measurement 60.

The component A shown in FIG. 6B is arranged in the lower part of FIG. 8; component A in this case serves as a Peltier cooler.

In this case, the thin-film solder according to the invention is used to bond on a fluidic cell and/or a capacitive humidity sensor; it is likewise possible for both the possible layer sequences for the solder metals to be used for this purpose.

The IDC structure 60 is tilted into the plane of the drawing, so that it can be seen more clearly. This example diagrammatically depicts the use of the solder according to the invention for the thermostating of a fluidic cell 50 on a Peltier cooler. In this context, use is made both of the internal bonding quality of the eutectic compound and also of the good thermal coupling to the Peltier heat sink. In this case, there is no electrical usage of the soldered joint.

Figure 9:
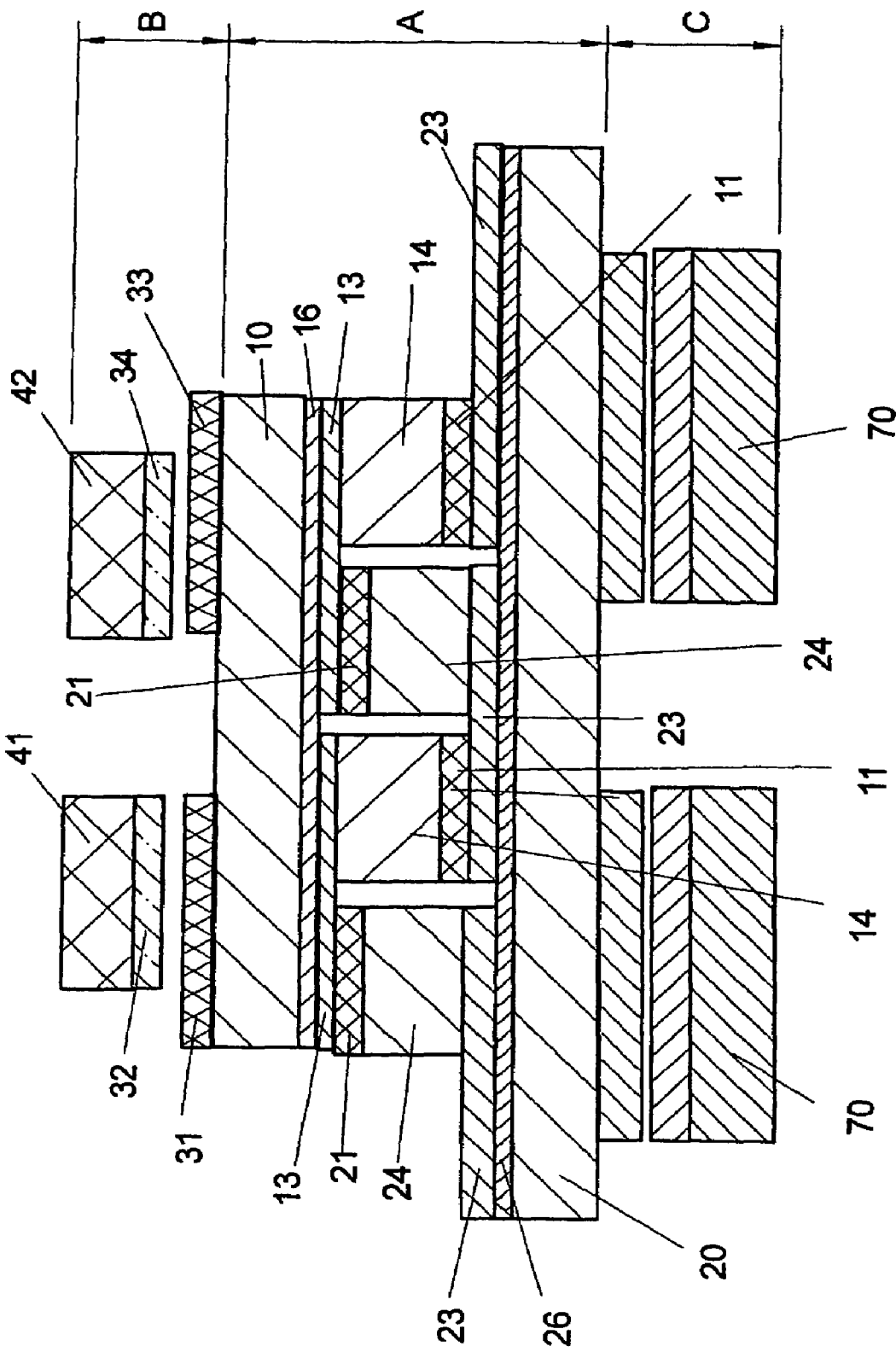
FIG. 9 shows an exemplary embodiment for a thin-film soldered joint according to the invention with a heat sink.

In a refinement of the exemplary embodiment shown in FIG. 7, FIG. 9 diagrammatically depicts the simultaneous use of the thin-film solder with and without electrical functionality. The first component A corresponds to the item illustrated in FIG. 6B. A second component, namely a laser diode circuit 41, 42 as shown in FIG. 7, is arranged above the component A.

In accordance with the embodiment shown in FIG. 9, to further the embodiment shown in FIG. 7, the solder is used to bond on heat sinks 70 (third component C), in which context it is likewise possible to use both the possible layer sequences, cf. FIG. 9, for the solder metals.

The heat sink 70 may comprise a (100) anisotropically KOH-etched Si wafer. In this application example, both the internal bonding quality of the eutectic compound and the good thermal coupling to the Peltier heat sink are utilized. There is no electrical utilization in this context.

The implementation of the invention is not restricted to the preferred exemplary embodiments which have been outlined above. Rather, numerous variants which make use of the thin-film solder according to the invention, the component or device according to the invention and the process according to the invention even in implementations of fundamentally different type, are also conceivable.

We claim:

1. A microelectromechanical component having at least one soldering layer for joining to at least one further component, which component includes at least one soldering layer made from a solder comprising a eutectic mixture of gold and bismuth and a bismuth layer for producing a soldered joint with to a gold layer.

2. The microelectromechanical component as claimed in claim 1, which includes soldering layers on opposite sides for joining to at least two further components.

3. The microelectromechanical component as claimed in claim 1, wherein at least one soldering layer, prior to the soldering operation, has a layer thickness of from 100 nm to 10 μm.

4. A microelectromechanical device, wherein a soldered joint including a solder comprising a eutectic mixture of gold and bismuth joins at least two components, at least one component comprises at least two substrates joined together by said solder, and each substrate has a thermoelectric material facing the other substrate arranged thereon, wherein an orientation of a layer arrangement of the thermoelectric material and the solder of each of the at least two substrates is alternatingly spaced between the thermoelectric material of the other of the at least two substrates.

5. The microelectromechanical device as claimed in claim 4, wherein said thermoelectric material is arranged in the form of one of a Peltier cooler and a thermoelectric transducer.

6. The microelectromechanical device as claimed in claim 4, wherein at least one soldered joint joins a component to a laser diode circuit.

7. The microelectromechanical device as claimed in claim 4, wherein at least one soldered joint joins a component to a fluidic cell.

8. The microelectromechanical device as claimed in claim 4, wherein at least one soldered joint joins a component to an IDC structure as humidity sensor.

9. The microelectromechanical device as claimed in claim 4, wherein at least one soldered joint joins a component to a heat sink.

10. The microelectromechanical device as claimed in claim 4, wherein at least one soldered joint joins a component to one of an optoelectronic amplifier, an optoelectronic modulator, an LED, a photodiode, a phototransistor and an optocoupler.

11. The micro electromechanical device as claimed in claim 4, wherein a joint is formed by means of submount technology using the solder.

12. A microelectromechanical device as claimed in claim 4, wherein at least one component has one of an electrical functionality, a thermal functionality, and a bonding functionality.

* * * * *